(12) United States Patent
Srinivasa et al.

(10) Patent No.: US 9,106,370 B1
(45) Date of Patent: Aug. 11, 2015

(54) ENHANCED CLOCK AND DATA RECOVERY ACQUISITION IN THE PRESENCE OF LARGE FREQUENCY OFFSETS

(71) Applicant: Avago Technologies General IP (Singapore) Pte. Ltd., Singapore (SG)

(72) Inventors: Sunil Srinivasa, San Jose, CA (US); Amaresh V. Malipatil, San Jose, CA (US); Mohammad Shafiul Mobin, Orefield, PA (US); Pervez Mirza Aziz, Dallas, TX (US); Shiva Prasad Kotagiri, San Jose, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/495,931

(22) Filed: Sep. 25, 2014

(51) Int. Cl.
*H04L 7/00* (2006.01)
*H03D 3/24* (2006.01)

(52) U.S. Cl.
CPC ................................... *H04L 7/0016* (2013.01)

(58) Field of Classification Search
CPC ........... H03L 7/093; H03L 7/107; H03L 7/00; H03L 7/10; H04L 7/0331
USPC .................................................. 375/355, 376
See application file for complete search history.

(56) References Cited

U.S. PATENT DOCUMENTS

| | | | |
|---|---|---|---|
| 7,149,914 B1 * | 12/2006 | Asaduzzaman et al. ....... | 713/500 |
| 7,495,517 B1 * | 2/2009 | Hoang et al. ................... | 331/16 |
| 7,555,087 B1 | 6/2009 | Asaduzzaman et al. | |
| 2004/0164811 A1 * | 8/2004 | Kawasumi et al. ............. | 331/16 |
| 2007/0253517 A1 * | 11/2007 | Aziz et al. ..................... | 375/373 |
| 2009/0160565 A1 * | 6/2009 | Kawamoto ..................... | 331/1 A |

* cited by examiner

*Primary Examiner* — Don N Vo
(74) *Attorney, Agent, or Firm* — Sheridan Ross P.C.

(57) ABSTRACT

A method for facilitating acquisition of a received reference clock signal in a CDR system includes steps of: initializing an integral register in a digital loop filter of the CDR system by setting a current value of the integral register to a first value; determining a number of mislock events occurring in a CDR loop of the CDR system, a mislock event being indicative of an unlocked state of the CDR loop; adjusting the current value of the integral register, when the number of mislock events is non-zero, by a second value to generate a new current value, the second value being a function of a negation of the current value of the integral register; and repeating the steps of determining the number of mislock events and adjusting the current value of the integral register until the number of mislock events is zero.

20 Claims, 11 Drawing Sheets

ENHANCED CLOCK AND DATA RECOVERY ACQUISITION IN THE PRESENCE OF LARGE FREQUENCY OFFSETS

FIELD OF INVENTION

The present invention relates generally to electrical and electronic circuitry, and more particularly relates to clock and data recovery.

BACKGROUND

In serializer/deserializer (SerDes) applications, particularly storage SerDes applications, it is common to have a large frequency offset (e.g., about 10,000 parts per million (ppm) or about 1%) between transmitter and receiver clocks. Though a clock and data recovery (CDR) loop in the SerDes receiver is typically designed for robust operation even in the presence of potentially large frequency offsets, the CDR loop will sometimes not be able to track frequency offsets within its theoretical acquisition capability. Understandably, this severely degrades system performance. In order to improve acquisition performance, a rotational frequency detection (RFD) algorithm is sometimes employed which utilizes an additional latch (e.g., eye scope/eye finder latch) to track a difference between the transmitter and receiver clocks, adjust integral register values, and subsequently acquire the transmitter clock. Unfortunately, however, using an RFD algorithm and associated eye scope latch substantially increases power consumption, hardware complexity and cost, which is undesirable. Moreover, use of the eye scope latch involves a stringent necessity to calibrate the latch accurately.

SUMMARY

In accordance with an embodiment of the invention, a method for facilitating the acquisition of a received reference clock signal in a clock and data recovery (CDR) system includes steps of: initializing an integral register in a digital loop filter of the CDR system by setting a current value of the integral register to a first value; determining a number of mislock events occurring in a CDR loop of the CDR system, a mislock event being indicative of an unlocked state of the CDR loop; adjusting the current value of the integral register, when the number of mislock events is non-zero, by a second value to generate a new current value, the second value being a function of a negation of the current value of the integral register; and repeating the steps of determining the number of mislock events and adjusting the current value of the integral register until the number of mislock events is zero indicative of the CDR system acquiring the received reference clock signal. Other embodiments of the invention include, but are not limited to, being manifest as a CDR apparatus, an integrated circuit including at least one CDR apparatus, a method for enhancing clock acquisition in the presence of a large frequency offset in CDR circuitry, and an electronic system. Additional and/or other embodiments of the invention are described in the following written description, including the claims, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that the drawings described herein are presented for illustrative purposes only. Moreover, common but well-understood elements and/or features that may be useful or necessary in a commercially feasible embodiment may not be shown in order to facilitate a less hindered view of the illustrated embodiments.

WRITTEN DESCRIPTION

Embodiments of the invention will be described herein in the context of illustrative clock and data recovery (CDR) circuitry for use, for example, in serializer/deserializer (SerDes) receiver circuitry of a data storage system. It should be understood, however, that embodiments of the invention are not limited to these or any other particular circuit arrangements or applications. Rather, embodiments of the invention are more broadly applicable to techniques for enhancing the acquisition of a reference clock. In this regard, embodiments of the invention provide an apparatus and methodology for beneficially acquiring a reference clock, even in the presence of potentially large frequency offsets, without the need for an additional eye scope latch, thus significantly reducing power, hardware complexity and cost, among other advantages.

It will become apparent to those skilled in the art given the teachings herein that numerous modifications can be made to the illustrative embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

Table of Acronym Definitions

| Acronym | Definition |
|---|---|
| SerDes | Serializer/deserializer |
| CDR | Clock and data recovery |
| RFD | Rotational frequency detection (or detector) |
| PLD | Programmable logic device |
| VCO | Voltage controlled oscillator |
| PPM | Parts per million |

Table of Acronym Definitions

| Acronym | Definition |
| --- | --- |
| LTR | Lock-to-reference |
| LTD | Lock-to-data |
| IREG | Integral register |
| UI | Unit interval |
| SSC | Spread spectrum clocking |

Figure 1:
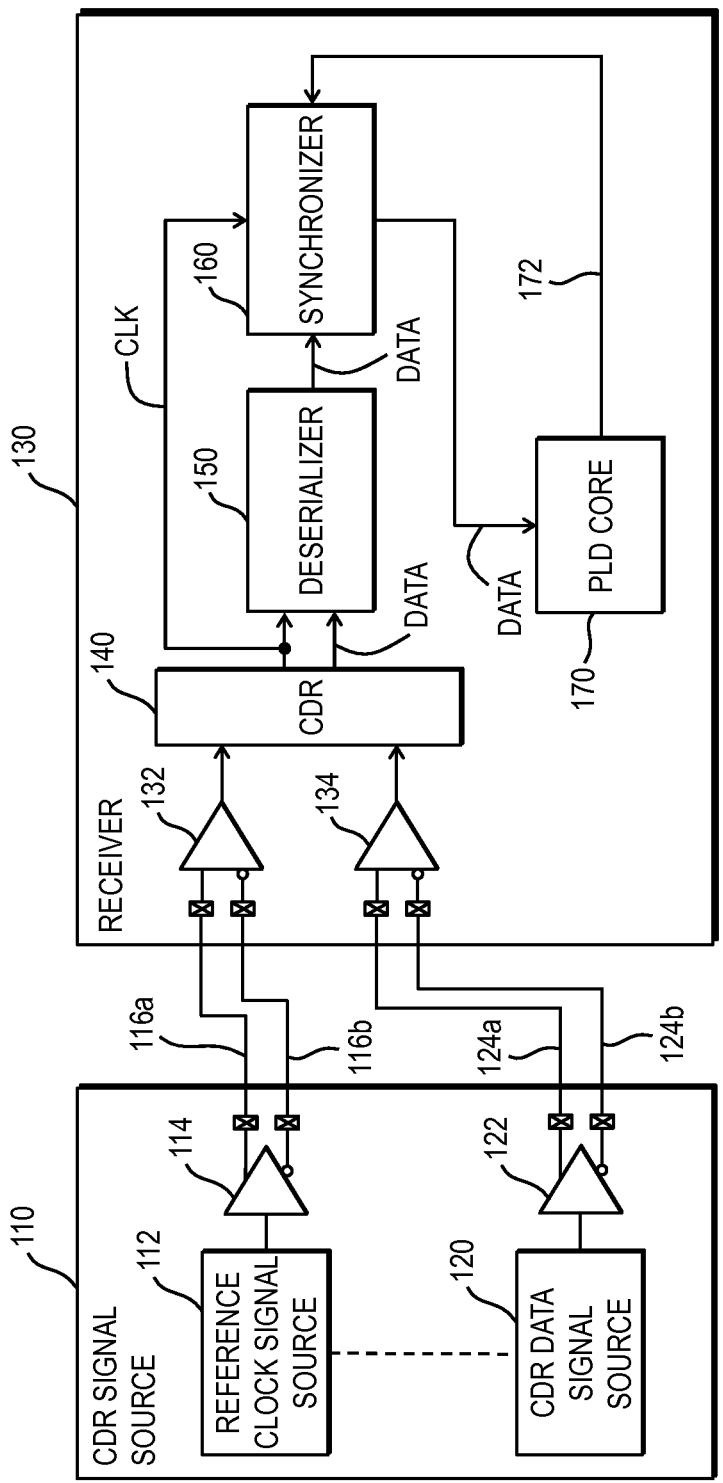
FIG. 1 is a block diagram depicting at least a portion of exemplary data communication system including clock and data recovery (CDR) circuitry which can be modified to implement one or more embodiments of the present invention.

FIG. 1 is a block diagram depicting at least a portion of an exemplary data communication system 100 including CDR circuitry which can be modified to implement one or more embodiments of the present invention. The system 100 includes a CDR signal source 110, which may be included in a SerDes transmitter or other signal generating apparatus. The CDR signal source 110, in this embodiment, includes a reference clock signal source 112 and a CDR data signal source 120, which can be conventional. The reference clock signal source 112 is operative to generate a reference clock signal having a frequency relationship with a clock frequency embedded in a CDR data signal generated by the CDR data signal source 120.

An output clock signal of the reference clock signal source 112 is applied to a first differential signaling driver 114 which is operative to generate a differential reference clock output signal conveyed via a corresponding differential communication channel comprised of at least connections 116a and 116b. Likewise, an output CDR data signal generated by the CDR data signal source 120 is applied to a second differential signaling driver 122 which is operative to generate a differential CDR data signal conveyed via a corresponding differential communication channel comprised of at least connections 124a and 124b. Although depicted as differential signals, it is to be appreciated that the reference clock signal and/or the CDR data signal may be transmitted as single-ended signals, in which case the corresponding transmission channels (e.g., connections 116a, 116b and/or 124a, 124b) may be singled-ended as well.

The clock and CDR data signals transmitted by the CDR signal source 110 are received by a receiver 130, which may be included in a local SerDes. More particularly, the differential reference clock signals conveyed by connections 116a and 116b are supplied to a first differential driver 132 in the receiver 130 which is operative to convert the differential reference clock signals back into a single-ended reference clock signal for application to CDR circuitry 140. Likewise, the differential CDR data signals transmitted on connections 124a and 124b are supplied to a second differential driver 134 in the receiver 130 which is operative to convert the differential CDR data signals back into a single-ended CDR data signal for application to the CDR receiver circuitry 140.

The CDR circuitry 140 uses the received reference clock signal and CDR data signal to recover a clock signal embedded in the CDR data signal, which is then used to recover a data signal from the CDR data signal. The signals are applied to a deserializer 150, which converts the applied serial data signal to parallel data signals. The parallel data signals are applied to a synchronizer 160 in synchronism with the clock signal produced by the CDR circuitry 140. The synchronizer 160 buffers the parallel data signals for application to a programmable logic device (PLD) core 170 in synchronism with another clock signal 172 supplied to the synchronizer by the PLD core.

Figure 2:
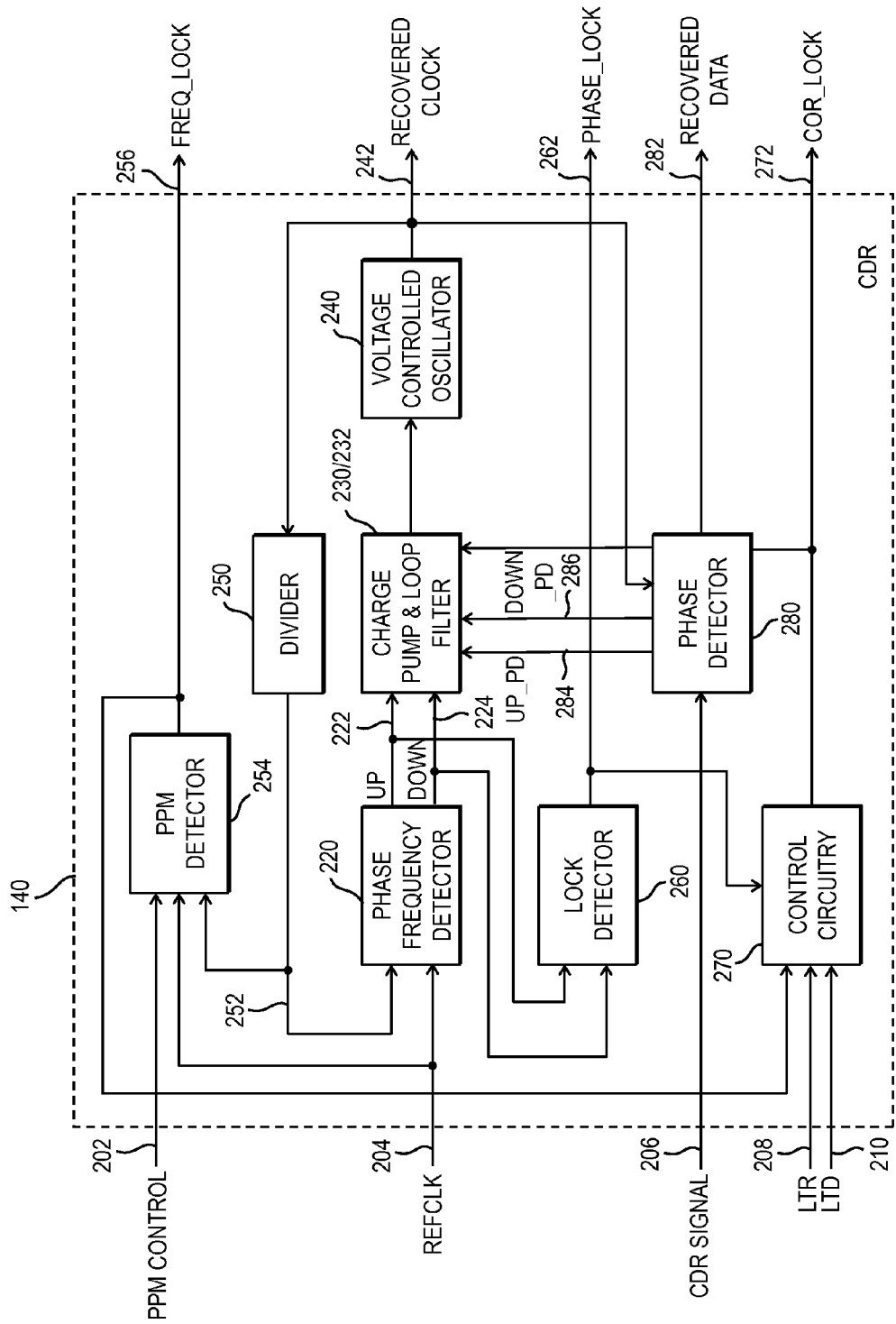
FIG. 2 is a block diagram depicting at least a portion of exemplary CDR circuitry which may be modified to implement one or more embodiments of the present invention.

FIG. 2 is a block diagram depicting at least a portion of an illustrative embodiment of the CDR receiver circuitry 140 shown in FIG. 1 which may be modified to implement one or more embodiments of the present invention. With reference to FIG. 2, the CDR receiver circuitry 140 includes a phase frequency detector 220 which receives as input a reference clock (REFCLK) signal 204 and an output signal 252 of a divider circuit 250 included in the CDR receiver circuitry. The phase frequency detector 220 compares a phase and frequency of the two signals it receives as inputs and outputs one of two signals, an up signal 222 and a down signal 224, which are indicative of whether a frequency of the output signal 252 of the divider circuit 250 should be increased or decreased to more closely match the phase and frequency of the reference clock signal 204.

The up signal 222 and down signal 224 are supplied to a charge pump 230. An output of the charge pump 230 is supplied to a loop filter 232 (shown in FIG. 2 as being integrated in the same block as the charge pump 230). The charge pump and loop filter 230/232 generate an output control signal which is used for controlling a frequency and/or phase of a voltage controlled oscillator (VCO) 240. The VCO 240 is operative to generate, as an output thereof, a recovered clock signal 242 that more closely matches the reference clock signal 204, in terms of phase and/or frequency. The recovered clock signal 242 output by the VCO 240 is applied to the divider circuit 250 which is configured to divide the VCO output signal frequency by a prescribed scale factor to produce signal 252 which is supplied to the phase frequency detector 220.

The reference clock signal 204, the divider output signal 252, and a parts per million (PPM) control signal 202 are supplied to a PPM detector 254 which determines whether signal 252 has a frequency that is similar to the frequency of the reference clock signal 204. PPM detector 254 computes a frequency difference between the reference clock signal 204 and signal 252 and compares the frequency difference to a current PPM setting. The PPM setting can be dynamically adjusted using the PPM control signal 202, such as, for example, by increasing or decreasing the current PPM setting stored in the PPM detector 254 or setting a new PPM setting as the current PPM setting. If the frequency difference is at or less than the current PPM setting, the PPM detector 254 outputs a signal (FREQ_LOCK) 256 indicative of a frequency lock condition.

The up and down signals 222 and 224, respectively, generated by the phase frequency detector 220 are also supplied as inputs to a lock detector 260 which is configured to determine whether signal 252 has a phase that is similar to the phase of the reference clock signal 204. For example, when up signal 222 and down signal 224 are both logic 0, this may indicate that the frequency of signal 252 does not need to be increased or decreased. When this occurs, the lock detector 260 can output a phase lock (PHASE_LOCK) signal 262 indicative of a frequency lock condition. The frequency lock (FREQ_LOCK) signal 256, phase lock (PHASE_LOCK) signal 462, a lock-to-reference (LTR) signal 208, and a lock-to-data (LTD) signal 210 are supplied to control circuitry 270 in the CDR receiver circuitry 140. The control circuitry 270 directs the processing of data in the CDR circuitry 140 which can, in one or more embodiments, support a fixed data rate and/or a changing data rate.

A CDR_LOCK signal 272 generated by the control circuitry 270 is sent as input to the charge pump 230. The charge pump 230 may include circuitry that directs the processing of data in either a reference clock mode or a data mode based on the logic value of the CDR_LOCK signal 272. For example, when the CDR_LOCK signal 272 is logic 0, the charge pump 230 accepts as input up signal 222 and down signal 224 from the phase frequency detector 220 for processing in reference clock mode. When the CDR_LOCK signal 272 is logic 1, the charge pump 230 accepts as input an up_pd signal 284 and a down_pd signal 286 generated by a phase detector 280 for processing in data mode.

The phase detector 280 receives as input a CDR signal 206 and a recovered clock signal 242. The phase detector 280 is configured to compare the respective phases of the recovered clock signal 242 and the CDR signal 206 and outputs one of two signals, up_pd signal 284 and down_pd signal 286, which are indicative of whether the frequency of the recovered clock signal 242 needs to be increased or decreased to more closely match the phase of the CDR signal 206. Up_pd signal 284 and down_pd signal 286 are sent as inputs to the charge pump 230. The charge pump and loop filter 230/232 outputs a signal that is sent as input to the VCO 240 to produce the recovered clock signal 242 whose phase has been adjusted based on up_pd signal 284 and down_pd signal 286. The phase detector 280, using the recovered clock signal 242, generates a recovered data signal 282 based on the CDR signal 206.

CDR systems often employ well-known multiple-stage proportional-integral (PT) digital loop filters, typically having multiple integrators in series. In a second order loop filter, for example, a first integrator includes a proportional register (PREG) and a second integrator includes an integral register (IREG), which may be implemented in a known manner. The CDR system recovers or locks to an initially unknown phase offset and frequency offset present in the incoming signal. An integral state of the loop is directly related to the frequency offset between the reference and recovered clock signals. The IREG is typically initialized to a prescribed value (e.g., zero) and the IREG value will eventually converge to a value that is proportional to the frequency offset.

In some applications, such as, but not limited to, storage SerDes systems, for relatively large frequency offsets, the CDR circuitry may not lock even though the PPM frequency difference between the reference clock signal and the recovered clock signal is within the theoretical acquisition capability of the CDR circuitry. As previously stated, one conventional approach for improving reference clock acquisition performance is to employ rotational frequency detection (RFD). An RFD algorithm utilizes an additional latch (e.g., eye scope or eye finder latch) to track the difference between the transmitter and receiver clocks to determine cycle slip, to adjust IREG values in the digital loop filter of the CDR circuitry for reducing residual offset to facilitate CDR acquisition, and subsequently acquire the transmitter clock. Unfortunately, however, the additional eye scope latch and associated circuitry required by the RFD approach results in increased power, cost and hardware complexity, and furthermore necessitates accurate calibration of the latch.

One or more embodiments of the invention utilize an alternative methodology for initializing the integral register value(s) by counting the number of "mislock" events occurring at an input of the CDR phase detector, and using this information to acquire the reference clock despite potentially large frequency offsets. This novel approach eliminates the need for an eye scope latch and the overhead associated therewith, thereby reducing power consumption, cost and hardware complexity in the CDR circuitry, as well as eliminating the need for accurately calibrating the latch, which can be challenging. Additionally, embodiments of the invention work well in the presence of both positive and negative frequency offsets as well as constant and time-varying frequency offsets.

When there is a mis-acquisition in the presence of a frequency offset between a received reference clock signal and a recovered local clock signal generated by the CDR circuitry, a CDR loop, which may comprise a phase detector (e.g., bang-bang phase detector) and digital loop filters, for example, intermittently enters what is referred to as a mislock state, wherein a transition clock is substantially aligned with a center of a corresponding eye pattern and a data sampling clock, which is expected to align with the eye center and could be the same as the recovered clock, is substantially aligned with edges of the eye pattern. Stated another way, during mislock, the data sampling clock is aligned with the eye edge/crossing rather than the eye center, while the transition clock, which is a 90-degree phase shifted version of the data sampling clock, is aligned with the eye center rather than the eye edge; this can only occur when the recovered clock signal is erroneous. In such a scenario, either of the following two events will occur:

$$v(k-1) = -1, v\left(k - \frac{1}{2}\right) = +1, v(k) = -1,$$

or $$v(k-1) = +1, v\left(k - \frac{1}{2}\right) = -1, v(k) = +1,$$

where v(k) and v(k−1) refer to current and previous data sample values, respectively, and $$v\left(k - \frac{1}{2}\right)$$

refers to a transition sample value. The transition sampling value is the value of the signal measured at the eye transitions, which is the sample between two adjacent data sample values. These values are essentially inputs to a phase detector (e.g., bang-bang phase detector) in the CDR circuitry. Phase detectors generate a direct current (DC) component proportional to a difference in phase between its two (or more) input signals. Binary quantized phase detectors are also known as "bang-bang" phase detectors. The occurrence of any of the two events expressed above is termed a "mislock event," or simply a "mislock."

It can be shown that when the CDR circuitry is locked (i.e., no mislocks), the number of mislocks is always zero. The CDR circuitry being locked is indicative of the local recovered clock signal tracking the received reference clock signal; that is, when the CDR circuitry has acquired the reference clock signal. During a lock state of the CDR circuitry, the value of the integral register (IREG) in the CDR circuitry settles to a correct (i.e., expected) value. Conversely, when the CDR circuitry is not locked, the number of mislocks is non-zero. Moreover, it is empirically observed that the value in the IREG diverges to an incorrect value that is opposite in sign to that of the expected value. Based on these observations, an algorithm is derived, according to embodiments of the invention, for correcting the IREG divergence and thus facilitating CDR acquisition in the presence of relatively large frequency offsets (e.g., offsets as high as about 1%).

Figure 3:
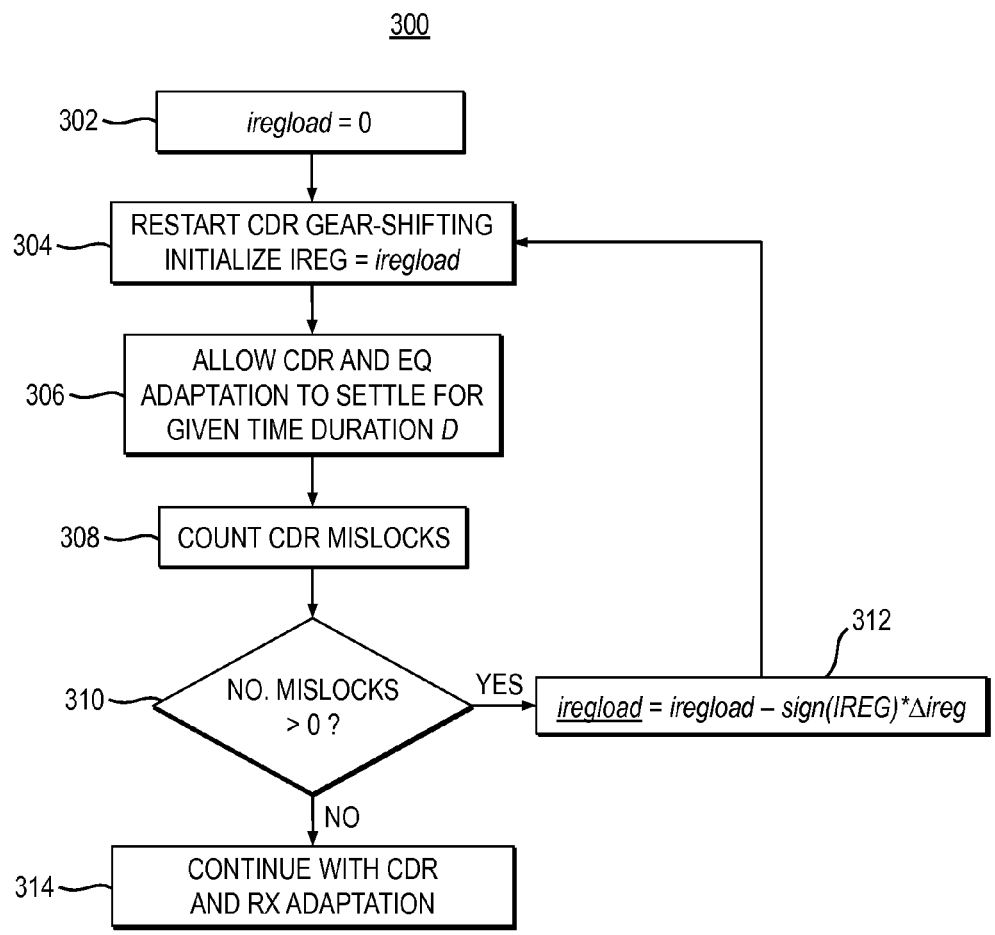
FIG. 3 is a flow diagram depicting at least a portion of an exemplary methodology for correcting integral register value divergence to thereby aid CDR acquisition in the presence of potentially large frequency offsets, according to an embodiment of the invention.

FIG. 3 is a flow diagram depicting at least a portion of an exemplary methodology 300 for correcting IREG value divergence to thereby aid CDR acquisition in the presence of potentially large frequency offsets, according to an embodiment of the invention. One or more embodiments of the invention correct the diverging IREG value at prescribed time intervals. With reference to FIG. 3, iregload is defined as a value that is loaded into the integral register IREG. In step 302 of the method 300, iregload is initially set to zero (i.e., iregload=0). A CDR acquisition/gear-shifting process is re-initiated in step 304 and the value iregload is loaded into the IREG (i.e., IREG=iregload). The gear-shifting process determines one or more parameters (e.g., gain parameter) for an integration path in the CDR system.

After allowing CDR and receiver (RX) equalization adaptation loops to converge for a prescribed time duration, D, in step 306, the number of mislocks in the CDR is counted in step 308. In one or more embodiments, the number of mislocks is simply quantified by counting the number of bang-bang input triples $$\left(v(k-1), v\left(k-\frac{1}{2}\right)\right)$$

and v(k)) with values as stated above; i.e., the number of cases where $$v(k-1) = -1, v\left(k-\frac{1}{2}\right) = +1, v(k) = -1,$$

or $$v(k-1) = +1, v\left(k-\frac{1}{2}\right) = -1, v(k) = +1.$$

While the number of mislocks is non-zero, as determined in step 310, the value of iregload is dynamically adjusted in step 312 by an amount equal to (−sign(IREG)·Δireg); that is, iregload=iregload−sign(IREG)·Δireg, where Δireg is a variable (i.e., programmable) number that controls convergence of the methodology 300. In one or more embodiments, Δireg is chosen empirically. If Δireg is low, convergence time is long. On the other hand, if Δireg is high, it may result in poor convergence (or no convergence). Thus, choosing the right value of Δireg is, in itself, a challenge.

As previously stated, when the number of mislocks is non-zero, IREG diverges to an incorrect value that is opposite in sign to that of its expected value. Thus, inverting (i.e., negating) the value of the IREG (i.e., −sign(IREG)) when the CDR circuitry is not locked facilitates convergence of the methodology 300 by moving the value of the IREG towards its expected convergence value. Once IREG is adjusted in step 312, the methodology 300 is repeated by restarting gear-shifting in step 304 and allowing the equalization loops to re-converge for a time duration D in step 306 before counting the number of CDR mislocks again in step 308.

When it is determined, in step 310, that the number is mislocks is zero, the CDR circuitry is presumed to be tracking the frequency offset correctly, and therefore CDR and receiver adaptation can continue at step 314. In accordance with one or more embodiments, convergence time may be significantly improved by gear-shifting the value of Δireg. The term "gear-shifting" as used herein is intended to broadly refer to a process whereby Δireg is initially set to a high value and is gradually decreased over time. In this manner, the algorithm is ensured to be robust and quickly convergent.

Figure 4:
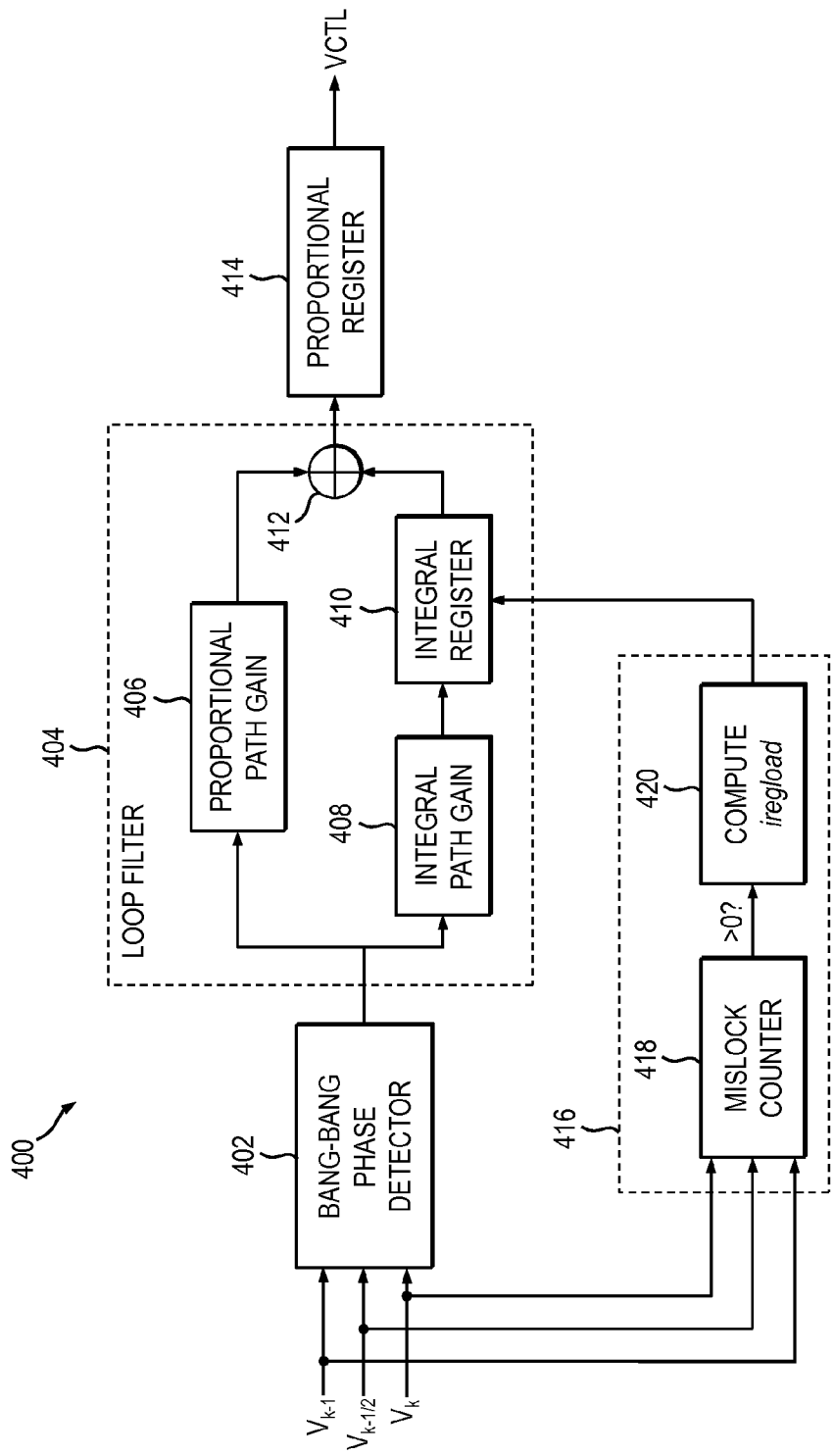
FIG. 4 is a block diagram depicting at least a portion of an exemplary CDR circuit including control circuitry for implementing one or more embodiments of the present invention.

In one or more embodiments, the exemplary methodology 300 is implemented in the CDR circuitry of a SerDes receiver (e.g., CDR circuit 140 in FIG. 1). FIG. 4 is a block diagram depicting at least a portion of an exemplary CDR circuit 400 including control circuitry for implementing one or more embodiments of the present invention. With reference to FIG. 4, current, transition and previous data sample values, $V_k$, $V_{k-1/2}$ and $V_{k-1}$, respectively, are supplied to corresponding inputs of a bang-bang phase detector 402. An output of the phase detector 402 is fed to a loop filter 404, which may be formed in a manner consistent with the loop filter 232 shown in FIG. 2. The loop filter 404 includes a proportional path gain module 406, an integral path gain module 408 and an integral register (IREG) 410. The proportional path gain module 406 and integral path gain module 408 are adapted to receive the output of the phase detector 402, and the output of the integral path gain module 408 is supplied to the integral register 410. Outputs of the proportional path gain module 406 and integral register 410 are summed together by an adder 412, and the summed output signal is fed to a proportional register 414.

The CDR circuit 400 further includes control circuitry 416 which, according to one or more embodiments, is configured to implement a methodology for correcting IREG value divergence, which may be consistent with the exemplary methodology 300 shown in FIG. 3. Specifically, the control circuitry 416 includes a mislock counter 418 and a computation module 420 coupled with the mislock counter. The mislock counter 418 is adapted to receive the current, transition and previous data sample values, $V_k$, $V_{k-1/2}$ and $V_{k-1}$, respectively, and is configured to generate an output signal indicative of a determination as to whether or not the number of mislock events occurring in the CDR circuit 400 is non-zero. In one or more embodiments, the number of mislocks is quantified by counting the number of bang-bang phase detector input triples $$\left(v(k-1), v\left(k-\frac{1}{2}\right)\right)$$

and v(k)) with values as stated above; i.e., the number of cases where $$v(k-1) = -1, v\left(k-\frac{1}{2}\right) = +1, v(k) = -1,$$

or $$v(k-1) = +1, v\left(k-\frac{1}{2}\right) = -1, v(k) = +1.$$

The output signal generated by the mislock counter 418 may be in the form of a binary flag or the like (e.g., logic 1 indicating that the number of mislocks is greater than zero or logic 0 indicating that the number of mislocks is zero). In other embodiments, the output signal generated by the mislock counter 418 is indicative of the number of mislocks occurring in the CDR circuit 400 over a prescribed period of time (e.g., digital count value). This output signal is used by the computation module 420 to select a value (iregload) to load into the integral register 410 to control convergence of the integral register and thereby facilitate acquisition of the reference clock, as previously explained.

By way of example only and without limitation, FIGS. 5 through 10 are waveforms depicting simulation results conceptually demonstrating convergence of the IREG under various illustrative conditions, according to embodiments of the present invention. For the waveforms shown in FIGS. 5 through 10, the time duration D for allowing the CDR and receiver equalization adaptation loops to converge is assumed to be 80,000 unit intervals (UI) and the parameter $\Delta$ireg that controls convergence is assumed to be 100,000.

Figure 5:
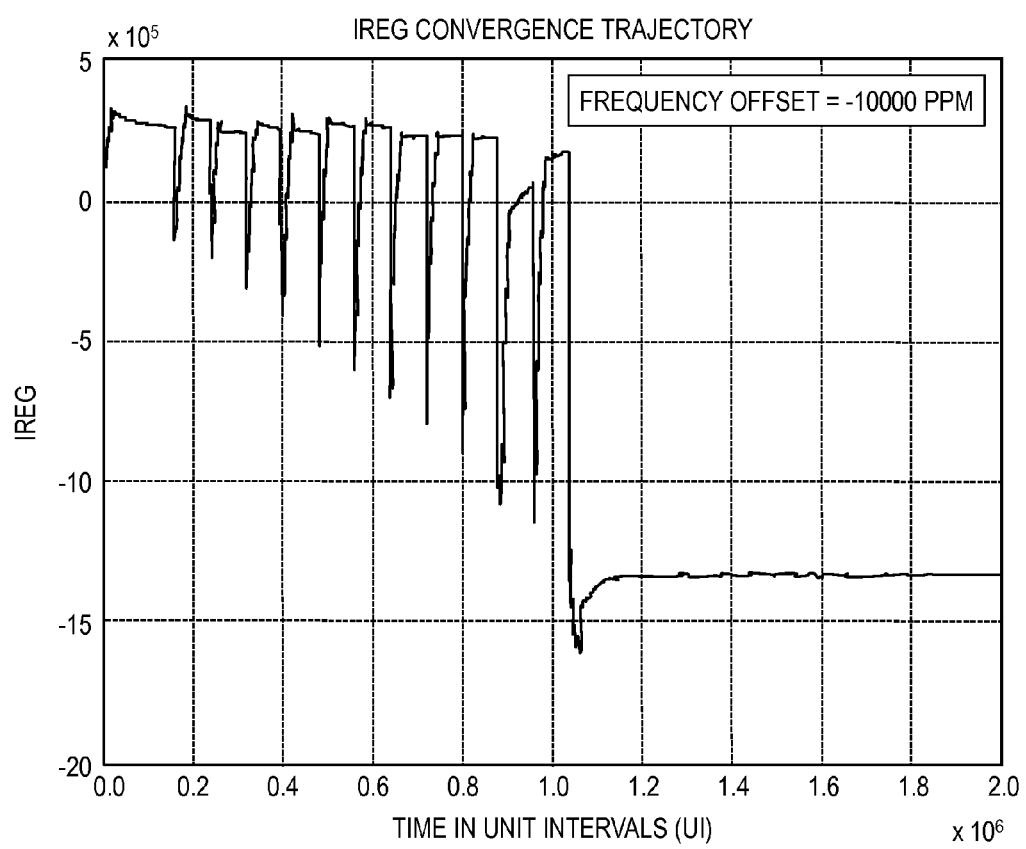
FIGS. 5 through 10 are waveforms illustrating exemplary simulation results conceptually demonstrating convergence of the integral register (IREG) under various conditions, according to embodiments of the invention.
Figure 6:
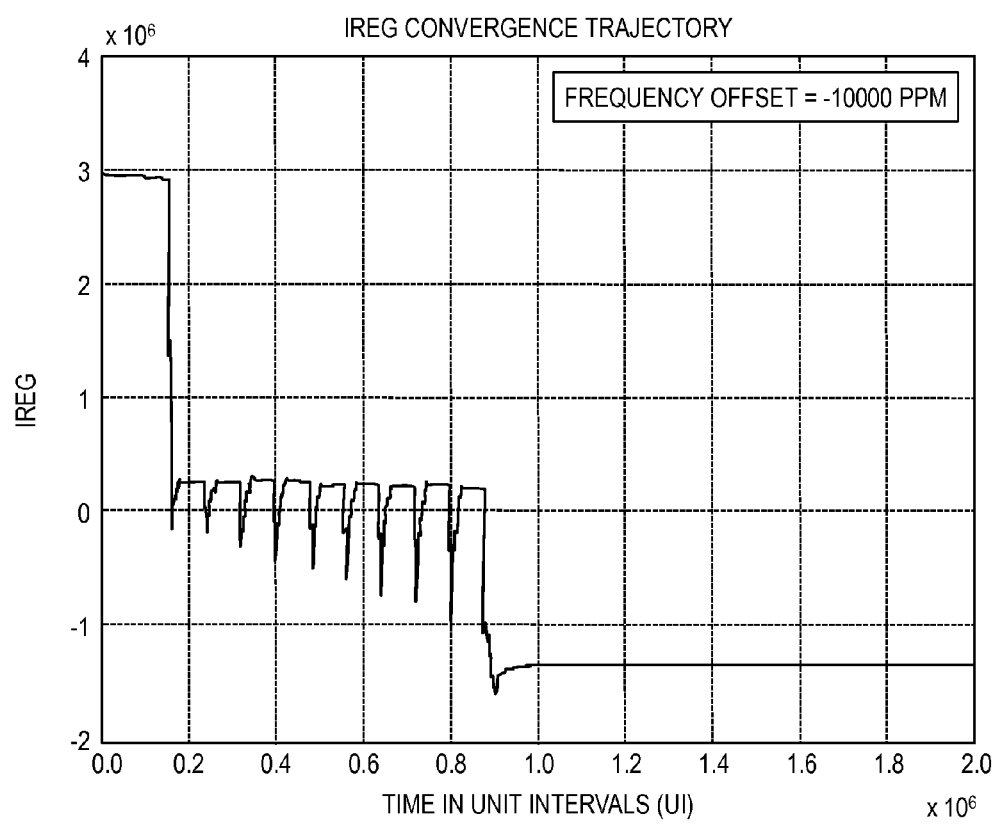
Figure 7:
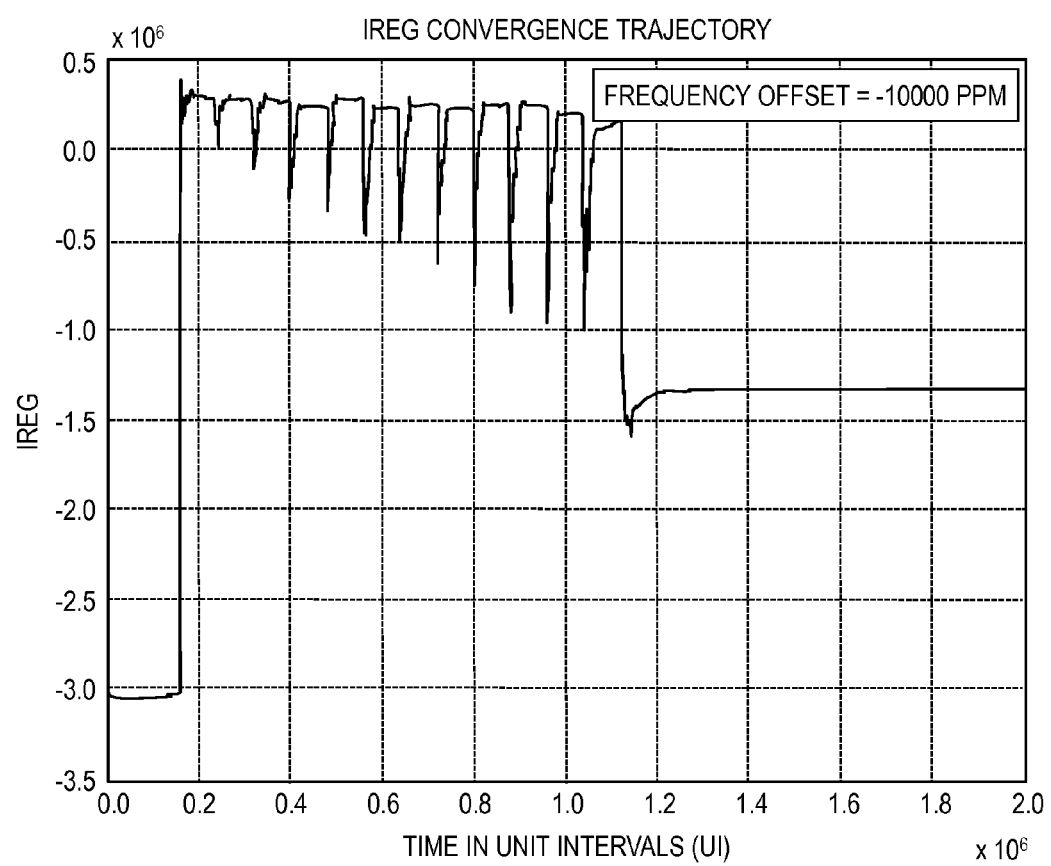
Figure 8:
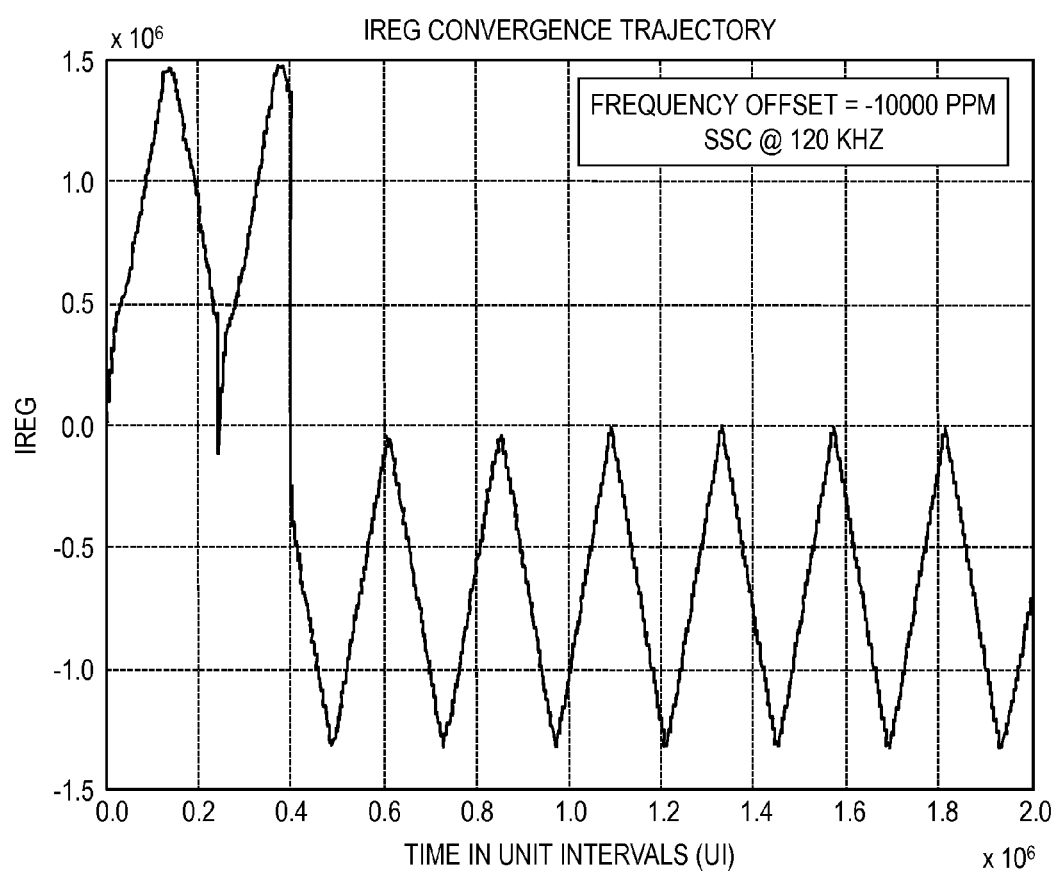
Figure 9:
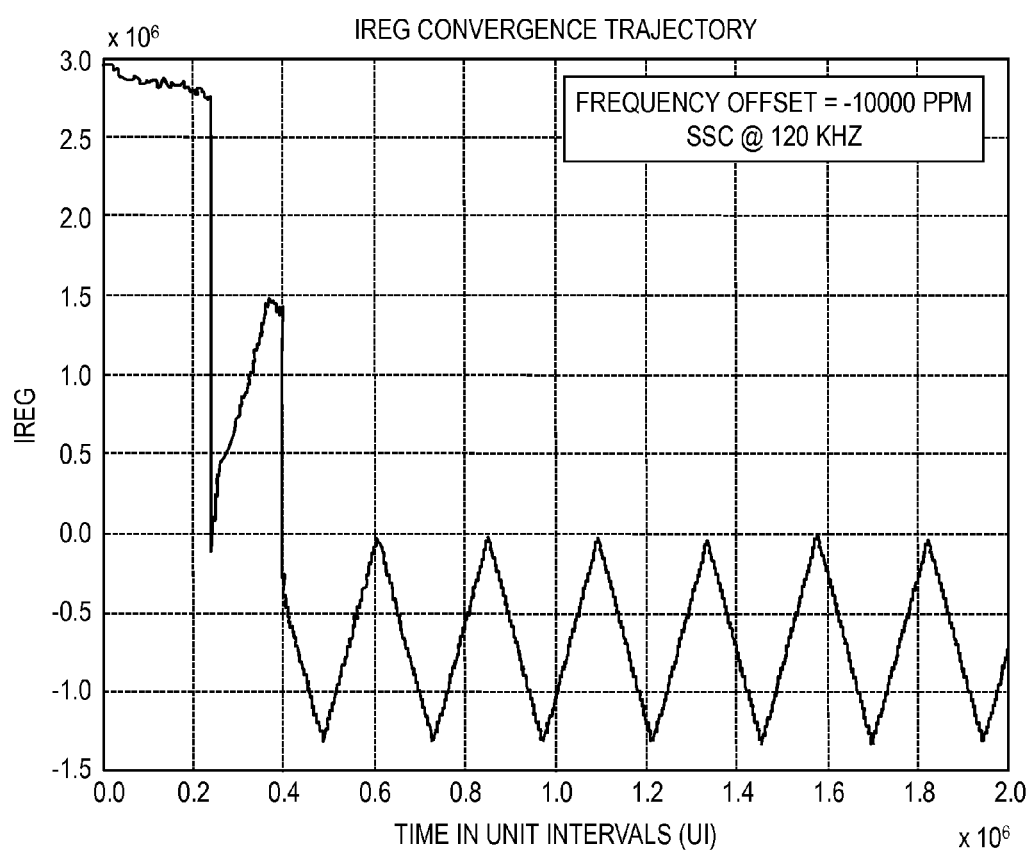
Figure 10:
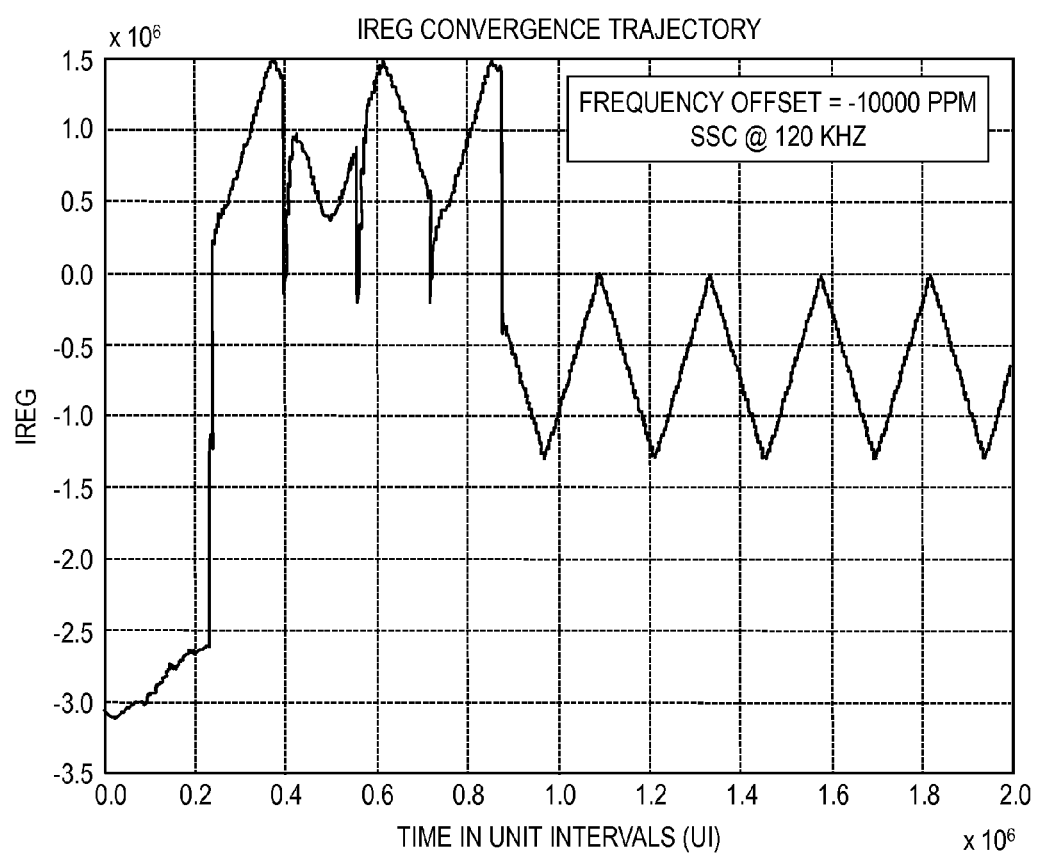

FIGS. 5 through 7 depict illustrative scenarios in which the frequency offset between the reference clock generated by a SerDes transmitter and the recovered clock generated by a SerDes receiver is −10,000 ppm fixed for three different starting values for the IREG, namely, 0, 300,000 and −300,000, respectively, to evaluate the robustness of the CDR acquisition methodology. FIGS. 8 through 10 depict illustrative scenarios in which the frequency offset between the reference clock and the recovered clock is −10,000 ppm with a time-varying frequency offset (e.g., spread spectrum clocking (SSC)) of 120 kHz for three different starting values for the IREG, namely, 0, 300,000 and −300,000, respectively.

In each of the exemplary scenarios shown in FIGS. 5 through 10, the CDR settles to a correct IREG value (e.g., about −1.35e6), thus verifying that the CDR circuitry is able to properly track the frequency offset. A "correct" IREG value may, according to one or more embodiments, be defined as the IREG settling to an expected value for a prescribed set of operating parameters, and thus the CDR circuitry is in a locked state; the IREG value is not necessarily the same for all operating conditions. For instance, for a given PPM number (e.g., 10,000 in the exemplary simulations shown in FIGS. 5 through 10), there is a corresponding value to which the IREG is expected to settle. It is to be appreciated that although various waveforms are shown in FIGS. 5 through 10 under prescribed operational parameters (e.g., ppm number, time duration D, $\Delta$ireg, and starting value for the IREG), embodiments of the invention are not limited to any specific values for these parameters.

As apparent from FIG. 5, with a fixed frequency offset of −10,000 ppm, $\Delta$ireg=100000, and the IREG initially set at 0 (i.e., IREG init=0), the IREG settles to its correct value within about 1.15e6 UI. As apparent from FIG. 6, under essentially the same operating parameters as in FIG. 4, but with the IREG initially set at 3.0e6 (i.e., IREG init=3000000), the IREG settles to its correct value within about 0.98e6 UI. Likewise, as apparent from FIG. 7, under essentially the same operating parameters as in FIG. 5, but with the IREG initially set at −3.0e6 (i.e., IREG init=−3000000), the IREG settles to its correct value within about 1.25e6 UI. Even with a time-varying frequency offset, as in the case of SSC, as apparent from FIG. 8, with a frequency offset of −10,000 ppm and SSC at 120 KHz, $\Delta$ireg=100000, and the IREG initially set at 0 (i.e., IREG init=0), the IREG settles to its correct value within about 0.4e6 UI. As apparent from FIG. 9, under essentially the same operating parameters as in FIG. 8, but with the IREG initially set at 3.0e6 (i.e., IREG init=3000000), the IREG settles to its correct value within about 0.4e6 UI. Similarly, as apparent from FIG. 10, under essentially the same operating parameters as in FIG. 8, but with the IREG initially set at −3.0e6 (i.e., IREG init=−3000000), the IREG settles to its correct value within about 0.9e6 UI.

As demonstrated by the exemplary simulation results shown in FIGS. 5 through 10, embodiments of the invention achieve enhanced performance in the presence of a constant frequency offset as well as in the presence of a time-varying frequency offset (e.g., SSC). Irrespective of the initial state of the IREG (i.e., value loaded into IREG), the IREG is seen to settle to a stable expected operating value. Furthermore, the performance of the acquisition methodology according to one or more embodiments of the invention is independent of a starting phase of the CDR circuitry and the methodology achieves a stable convergence of the IREG value in the presence of positive or negative frequency offset values. The methodology according to one or more embodiments can be implemented via simple circuitry, or a simple modification of existing CDR circuitry.

As will be appreciated by those skilled in the art, at least a portion of embodiments of the present invention may be implemented as an apparatus, system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to as a "circuit," "module," "block," or "system." Furthermore, embodiments of the present invention may take the form of a computer program product embodied in one or more non-transitory machine-readable medium(s) having machine-readable program code embodied thereon.

One or more embodiments of the invention, or elements thereof, can be implemented in the form of an apparatus including a memory and at least one processor coupled with the memory and operative to perform exemplary method steps in accordance with embodiments of the invention.

Figure 11:
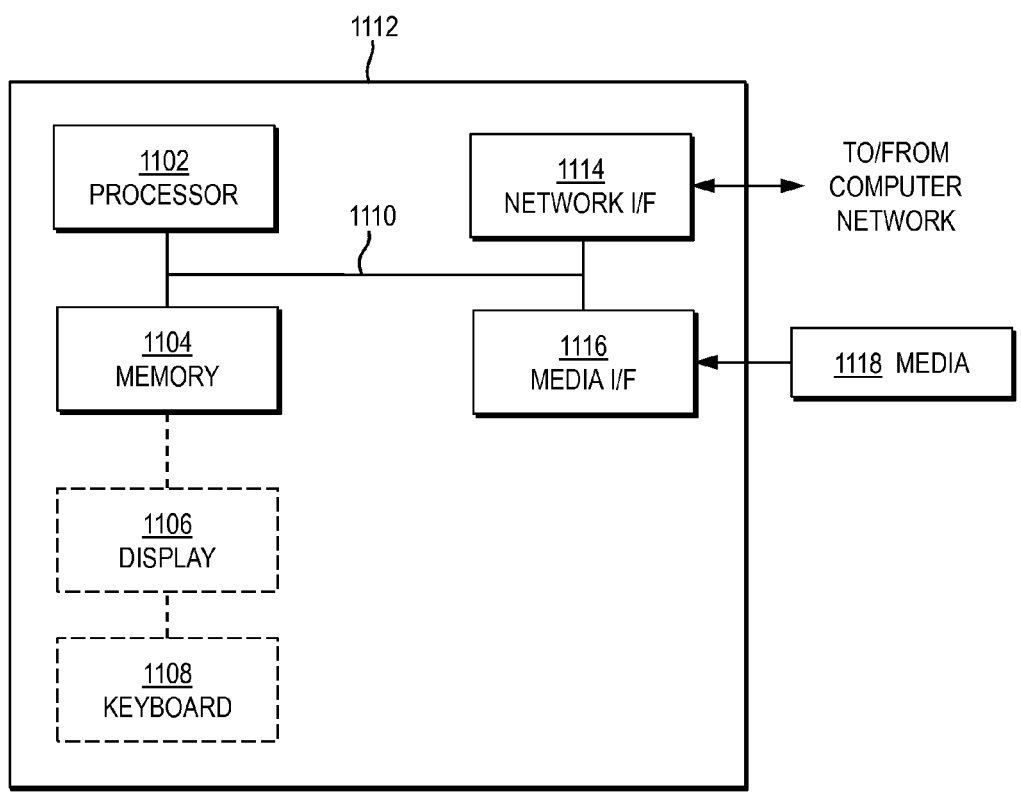
FIG. 11 depicts a computer system that may be useful in implementing at least a portion of one or more embodiments and/or elements of the invention.

One or more embodiments of the invention make use of software running on a general purpose computer or workstation which, when configured by the software, is transformed into a special purpose machine operative to perform methods in accordance with embodiments described herein. With reference to FIG. 11, such an implementation might employ, for example, a processor 1102, a memory 1104, and an input/output interface formed, for example, by a display 1106 and a keyboard 1108. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1102, memory 1104, and input/output interface such as display 1106 and keyboard 1108 can be interconnected, for example, via bus 1110 as part of a data processing unit 1112. Suitable interconnections, for example via bus 1110, can also be provided to a network interface 1114, such as a network card, which can be provided to interface with a computer network, and to a media interface 1116, such as a diskette or CD-ROM drive, which can be provided to interface with media 1118.

Accordingly, computer software including instructions or code for performing methodologies according to embodiments of the invention, as described herein, may be stored in one or more of the associated memory devices (for example, ROM, fixed or removable memory) and, when ready to be utilized, loaded in part or in whole (for example, into RAM)

and implemented by a CPU. Such software could include, but is not limited to, firmware, resident software, microcode, and the like.

A data processing system suitable for storing and/or executing program code will include at least one processor 1102 coupled directly or indirectly with memory elements 1104 through system bus 1110. The memory elements can include local memory employed during actual implementation of the program code, bulk storage, cache memories and embedded memory which provide temporary storage of at least a portion of program code in order to reduce the number of times the code must be retrieved from bulk storage during implementation.

Input/output or I/O devices (including but not limited to keyboards 1108, displays 1106, pointing devices, and the like) can be coupled to the system either directly (such as via bus 1110) or through intervening I/O controllers (omitted for clarity).

Network adapters such as network interface 1114 are also coupled with the system, in one or more embodiments of the invention, to enable the data processing system to become coupled with other data processing systems or remote printers or storage devices through intervening private or public networks. Modems, cable modem and Ethernet cards are just a few of the currently available types of network adapters.

As noted, one or more embodiments of the present invention may take the form of a computer program product embodied in one or more non-transitory machine- or computer-readable medium(s) having computer-readable program code embodied thereon. Any combination of one or more computer-readable medium(s) may be utilized. The computer-readable medium may be a computer readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. Media block 1118 is a non-limiting example. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing. In one or more embodiments, a computer-readable storage medium is any tangible medium that can contain or store a program, in a non-transitory manner, for use by or in connection with an instruction execution system, apparatus, or device.

Computer program code for carrying out operations according to one or more embodiments of the invention are written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program code, in one or more embodiments, is loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing functions/acts specified in a flowchart and/or block diagram block or blocks.

The block diagrams in the figures depict illustrative architectures, functionality, and operation of implementations of systems, methods and computer program products according to embodiments of the present invention. In this regard, each block shown in the block diagrams may represent a module, segment, or portion of code, which comprises one or more executable instructions for implementing specified functions. It should also be noted that, in one or more embodiments, functions represented by the blocks may occur out of the order noted in the figures. For example, two blocks shown in succession may, in fact, be executed substantially concurrently, or the blocks may sometimes be executed in the reverse order, depending upon the functionality involved. It will also be appreciated that each block of the block diagrams, and combinations of blocks in the block diagrams, can be implemented by special purpose hardware-based systems that perform the specified functions or acts, or combinations of special purpose hardware and computer instructions.

It should be understood that any of the methods described herein can include an additional step of providing a system comprising distinct software modules embodied on a non-transitory computer-readable storage medium; the modules include, in one or more embodiments, any or all of the elements depicted in the block diagrams and/or described herein; by way of example and without limitation, a lock detector (or mislock counter), computation module, digital loop filter, equalization adaptation module and control module. The method steps can then be carried out using the distinct software modules and/or sub-modules of the system, executing on one or more hardware processors 1102. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application-specific integrated circuits (ASICs), functional circuitry, one or more appropriately programmed general purpose digital computers with associated memory, and the like. Given the teachings of the invention provided herein, one of ordinary skill in the related art will be able to contemplate other implementations of the components of the invention.

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Written Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Written Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A method for facilitating acquisition of a received reference clock signal in a clock and data recovery (CDR) system, the method comprising:
    initializing an integral register in a digital loop filter of the CDR system by setting a current value of the integral register to a first value;
    determining a number of mislock events occurring in a CDR loop of the CDR system, a mislock event being indicative of an unlocked state of the CDR loop;
    adjusting the current value of the integral register, when the number of mislock events is non-zero, by a second value to generate a new current value, the second value being a function of a negation of the current value of the integral register; and
    repeating the steps of determining the number of mislock events and adjusting the current value of the integral register until the number of mislock events is zero indicative of the CDR system acquiring the received reference clock signal.

2. The method of claim 1, wherein adjusting the current value of the integral register comprises one of adding the second value to and subtracting the second value from the current value to generate the new current value.

3. The method of claim 1, wherein the second value is generated according to an expression $-\text{sign}(\text{IREG}) \cdot \Delta \text{ireg}$, where $-\text{sign}(\text{IREG})$ is indicative of whether the current value of the integral register is positive or negative and $\Delta \text{ireg}$ is a variable number that controls convergence of the method, and wherein adjusting the current value of the integral register to generate the new current value comprises dynamically subtracting the second value from the current value of the integral register.

4. The method of claim 3, wherein repeating the steps of determining the number of mislock events and adjusting the current value of the integral register further comprises initially setting $\Delta \text{ireg}$ to a high value and gradually decreasing $\Delta \text{ireg}$ over a prescribed period of time.

5. The method of claim 1, wherein repeating the steps of determining the number of mislock events and adjusting the current value of the integral register further comprises resetting a gain of a digital loop filter in the CDR loop to an initial value.

6. The method of claim 1, further comprising allowing equalization adaptation loops in the CDR system to converge for a prescribed duration of time prior to determining the number of mislock events occurring in the CDR loop.

7. The method of claim 1, further comprising, when the number of mislock events is zero, performing at least one of CDR adaptation and receiver adaptation.

8. The method of claim 1, wherein determining the number of mislock events comprises quantifying the number of mislock events by counting a number of input samples $$\left(v(k-1), v\left(k - \frac{1}{2}\right)\right.$$

and $v(k)$) with values $$v(k-1) = -1, v\left(k - \frac{1}{2}\right) = 1, v(k) = -1,$$

or $$v(k-1) = 1, v\left(k - \frac{1}{2}\right) = -1, v(k) = 1,$$

where $v(k)$ and $v(k-1)$ refer to current and previous data sample values, respectively, and $$v\left(k - \frac{1}{2}\right)$$

refers to a transition sample value.

9. The method of claim 1, wherein determining the number of mislock events comprises generating a count value that is indicative of the number of mislock events occurring over a prescribed period of time.

10. An apparatus for facilitating acquisition of a received reference clock signal in a clock and data recovery (CDR) system, the apparatus comprising:
- a counter configured to receive current, transition and previous data sample values, $V_k$, $V_{k-1/2}$ and $V_{k-1}$, respectively, and to generate an output indicative of a determination as to whether a number of mislock events occurring in a CDR loop of the CDR system is non-zero, a mislock event being indicative of an unlocked state of the CDR loop; and
- a controller coupled with the counter and configured: to initialize an integral register in a digital loop filter of the CDR system by setting a current value of the integral register to a first value; and to adjust the current value of the integral register, when the number of mislock events is non-zero, by a second value to generate a new current value, the second value being a function of a negation of the current value of the integral register, the controller adjusting the current value of the integral register until the number of mislock events is zero indicative of the CDR system acquiring the received reference clock signal.

11. The apparatus of claim 10, wherein the controller is further configured to adjust the current value of the integral register by one of adding the second value to and subtracting the second value from the current value to generate the new current value.

12. The apparatus of claim 10, wherein the controller is configured to generate the second value according to an expression −sign(IREG)·Δireg, where −sign(IREG) is indicative of whether the current value of the integral register (IREG) is positive or negative and Δireg is a programmable number that controls convergence of the integral register, and wherein the controller is configured to adjust the current value of the integral register to generate the new current value by dynamically subtracting the second value from the current value of the integral register.

13. The apparatus of claim 10, wherein the controller is configured to delay the counter from determining the number of mislock events occurring in the CDR loop to allow equalization adaptation loops in the CDR system to converge for a prescribed duration of time.

14. The apparatus of claim 10, wherein the controller is configured to perform at least one of CDR adaptation and receiver adaptation when the number of mislock events is zero.

15. A clock and data recovery (CDR) circuit, comprising:
- a phase detector configured to receive a reference clock signal and a recovered clock signal and to generate a first control signal indicative of difference in at least one of phase and frequency of the reference and recovered clock signals;
- a voltage controlled oscillator (VCO) configured to generate the recovered clock signal, at least one of a phase and a frequency of the recovered clock signal varying as a function of a second control signal;
- a loop filter coupled with the phase detector, the loop filter including an integral register, the loop filter generating the second control signal;
- a counter configured to receive current, transition and previous data sample values corresponding to the reference clock signal and to generate an output indicative of a determination as to whether a number of mislock events occurring in the CDR circuit is non-zero, a mislock event being indicative of an unlocked state of the CDR circuit; and
- a controller coupled with the counter and integral register and configured to set a current value of the integral register to a first value and to adjust the current value of the integral register, when the number of mislock events is non-zero, by a second value to generate a new current value, the second value being a function of a negation of the current value of the integral register, the controller adjusting the current value of the integral register until the number of mislock events is zero indicative of the CDR circuit acquiring the received reference clock signal.

16. The circuit of claim 15, wherein the loop filter further comprises a proportional path gain module and an integral path gain module, the proportional path gain module and integral path gain module being configured to receive the first control signal generated by the phase detector, an output of the integral path gain module being supplied to the integral register, respective outputs of the proportional path gain module and integral register being summed together to form a summed output signal, the second control signal being a function of the summed output signal.

17. The circuit of claim 16, wherein respective gains of each of the outputs of the proportional path gain module and integral register are controlled as a function of the first control signal.

18. The circuit of claim 15, wherein the controller is configured to generate the second value according to an expression −sign(IREG)·Δireg, where −sign(IREG) is indicative of whether the current value of the integral register is positive or negative and Δireg is a programmable number that controls convergence of the CDR circuit, and wherein the controller is configured to adjust the current value of the integral register to generate the new current value by dynamically subtracting the second value from the current value of the integral register.

19. The circuit of claim 15, wherein the controller is configured to delay the counter from determining the number of mislock events occurring in the CDR circuit to allow equalization adaptation loops in the CDR circuit to converge for a prescribed duration of time.

20. The circuit of claim 15, wherein the controller is configured to perform at least one of CDR adaptation and receiver adaptation when the number of mislock events is zero.

* * * * *